United States Patent [19]
Chen et al.

[11] Patent Number: 6,134,701
[45] Date of Patent: Oct. 17, 2000

[54] COMPUTER MOTHERBOARD WITH A CONTROL CHIP HAVING SPECIFIC PIN ARRANGEMENT FOR FAST CACHE ACCESS

[75] Inventors: Shu-Hui Chen, Ban-Chiao; Tsai-Sheng Chen, Hsing-Tien; Nai-Shung Chang, Yung-Ho, all of Taiwan

[73] Assignee: Via Technologies, Inc., Hsin Tien, Taiwan

[21] Appl. No.: 09/159,441

[22] Filed: Sep. 22, 1998

[51] Int. Cl.[7] ..................................................... G06F 3/00
[52] U.S. Cl. ........................................ 716/8; 716/1; 716/2
[58] Field of Search .................................. 710/100, 101; 716/8, 2, 10, 12, 1

[56] References Cited

U.S. PATENT DOCUMENTS

| | | | |
|---|---|---|---|
| 5,604,888 | 2/1997 | Kiani-Shabestari et al. | 395/500 |
| 5,815,673 | 2/1999 | Mote, Jr. | 395/287 |
| 5,915,265 | 6/1999 | Crocker et al. | 711/170 |

*Primary Examiner*—Ayaz R. Sheikh
*Assistant Examiner*—Tim Vo

*Attorney, Agent, or Firm*—Winston Hsu

[57] ABSTRACT

The present invention provides a computer motherboard having an Intel P54C compatible processor socket and a control chip having specifically arranged data pins and address pins which allows a short signal path arrangement from the processor socket to a cache tap RAM and a cache data RAM. The computer motherboard comprises a four-layer printed circuit board, a processor socket, a cache data RAM, a cache tag RAM, and a control chip. All these components are connected by using a high-order-bit data bus, a low-order-bit data bus, and an address bus through the top and bottom layers of the circuit board. The cache data RAM is positioned on the right side of the processor socket. The control chip is positioned on the top side of the cache data RAM and on the top-right side of the processor socket. It comprises an address section positioned at a bottom-middle portion of the control chip, a high-order-bit data section positioned at a bottom-right corner of the control chip, and a low-order-bit data section positioned at a bottom-left corner of the control chip. The cache tag RAM is positioned between the processor socket and the cache data RAM.

19 Claims, 6 Drawing Sheets

COMPUTER MOTHERBOARD WITH A CONTROL CHIP HAVING SPECIFIC PIN ARRANGEMENT FOR FAST CACHE ACCESS

BACKGROUND OF THE INVENTION

1. Field of the Invention

The present invention relates to a computer motherboard, and more particularly, to a computer motherboard with a control chip having specific data pin and address pin arrangement for fast cache access.

2. Description of the Prior Art

Figure 1:
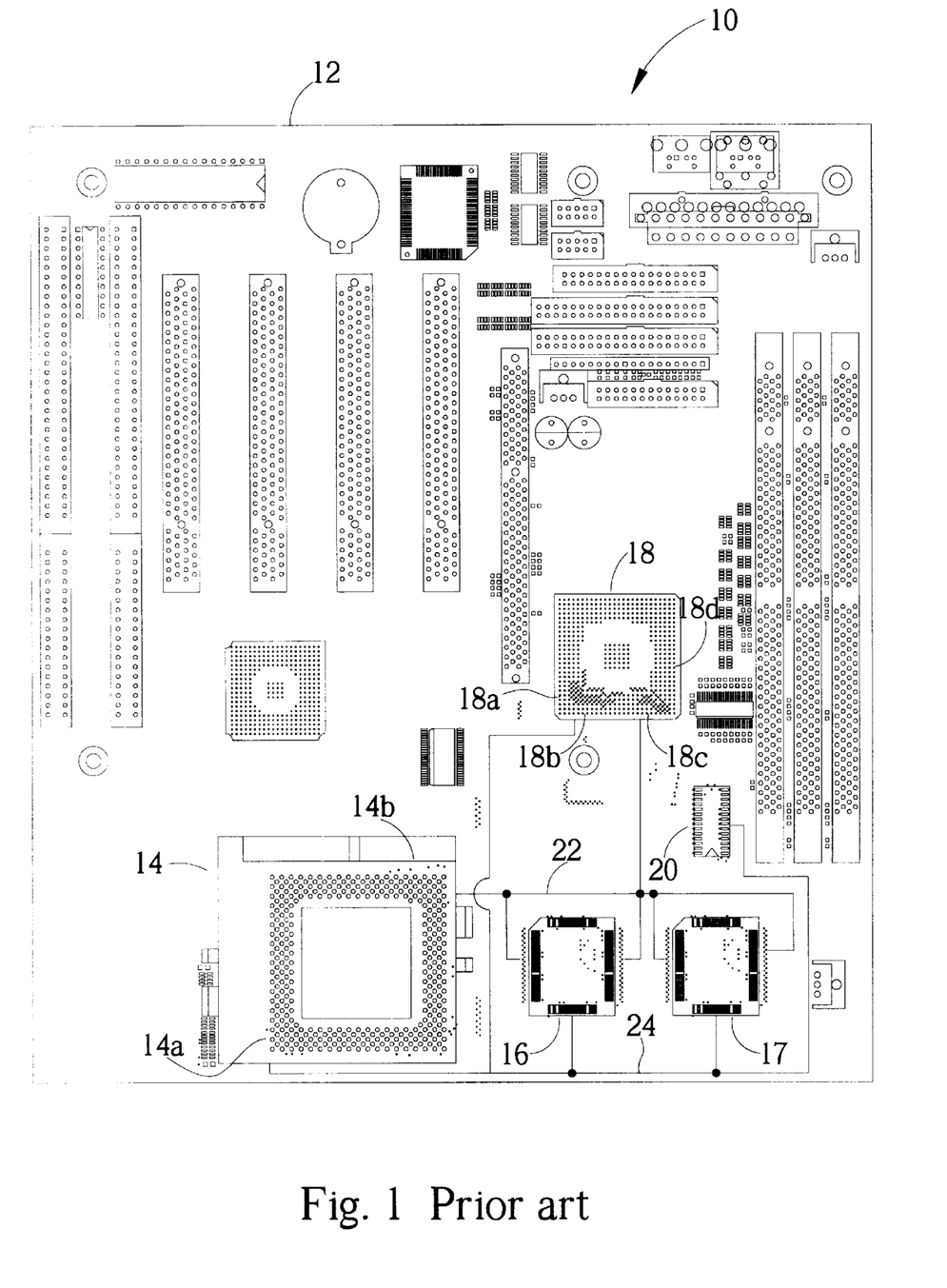
FIG. 1 is a component layout diagram of a prior art computer motherboard.

Please refer to FIG. 1. FIG. 1 is a component layout diagram of a prior art computer motherboard 10. The computer motherboard 10 comprises a four-layer printed circuit board 12, a processor socket 14, two cache data RAMs 16 and 17, a control chip 18, a cache tag RAM 20, a data bus 22 having 64 conductors, and an address bus 24 having 32 conductors.

The four-layer printed circuit board 12 comprises a top layer, a bottom layer, and the two middle layers for connecting power supply and ground. FIG. 1 shows a component layout diagram of the top layer of the motherboard 10. The top layer has top, bottom, left and right sides. The processor socket 14 is installed at the bottom-left portion of the circuit board 12, the cache data RAMs 16 and 17 are installed next to the right side of the processor socket 14, the cache tag RAM 20 is installed next to the top side of the cache data RAM 17, and the control chip 18 is installed next to the top side of the cache data RAM 16 and the top-right side of the processor socket 14.

The pin definition of the processor socket 14 is compatible with the Intel Processor P54C. The processor socket 14 comprises an address section 14a having 32 address pins (A0–A31) positioned at the bottom-left corner of the processor socket 14, and a data section 14b having 64 data pins (D0–D63) positioned at the right side of the processor socket 14. The control chip 18 comprises an address section 18a, processor control section 18b, data section 18c, and cache tag RAM control section 18d arranged from left to right at the bottom side of the control chip 18. The address section 18a comprises 32 address pins (A0–A31), the data section 18c comprises 64 data pins, and each of the processor control section 18b and cache tag RAM control section 18d comprises a plurality of control pins.

The data bus 22 connects the data section 14b at the right side of the processor socket 14, the cache data RAMs 16 and 17, and the data section 18c of the control chip 18. And the address bus 24 connects the address section 14a at the bottom-left corner of the processor socket 14, the cache data RAMs 16 and 17, and the cache tag RAM 20 around the bottom sides of the processor socket 14 and the cache data RAMs 16, 17. In this layout, the length of the address bus 24 between the address section 14a of the processor socket 14 and the cache tag RAM 20 is 9800 mil which causes nearly 2.5 ns signal delay. The length of the address bus 24 between the cache tag RAM 20 and the address section 18a of the control chip 18 is 4200 mil which causes about 1.2 ns signal delay. And the length of the address bus 24 between the address section 14a of the processor socket 14 and the cache data RAM 16 is 8500 mil which results in a roughly 2 ns signal delay. These signal delays do not have too much impact over address data transmission from the processor socket 14 to the cache tag RAM 20 and cache data RAM 16 when the interface speed of the processor socket 14 is running below or around 66 MHz. However, when the interface speed of the processor socket 14 increases to a higher level such as 100 MHz, such signal delays will seriously affect the transmission speed of address data from the processor to the cache tag RAM 20 and to the cache data RAMs 16 and 17 because the allowable transmission time per clock cycle is very limited. In order to reduce these signal delays, each component on the circuit board 12 and the positions of the data bus 22 and the address bus 24 have to be rearranged. However, the pin arrangement of the prior art control chip 18, especially the data section 18c and the address section 18a, makes it very difficult to rearrange the positions of the processor socket 14, control chip 18, cache tag RAM 20, and cache data RAMs 16 and 17 to shorten the length of the address bus 24 between the processor socket 14, control chip 18, cache tag RAM 20, and cache data RAMs 16 and 17.

SUMMARY OF THE INVENTION

It is therefore a primary objective of the present invention to provide a computer motherboard for solving the signal delay problem of the prior art computer motherboard.

In a preferred embodiment, the present invention provides a computer motherboard comprising:

a rectangular four-layer printed circuit board comprising a top layer and a bottom layer, the top layer comprising top, bottom, left and right sides;

a processor socket installed near the bottom-left corner of the top layer of the circuit board, the processor socket comprising an address section having a plurality of address pins positioned at a top-right corner of the processor socket, and a data section having a plurality of data pins positioned at a left side of the processor socket, the data section being divided into a high-order-bit data section having a plurality of high order data pins positioned at a bottom-left corner of the processor socket, and a low-order-bit data section having a plurality of low order data pins positioned at a top-left corner of the processor socket;

a cache data RAM installed on the top layer of the circuit board positioned approximately on the right side of the processor socket, the cache data RAM comprising a high-order-bit data section having a plurality of high order data pins, a low-order-bit data section having a plurality of low order data pins, and an address section having a plurality of address pins;

a control chip installed on the top layer of the circuit board positioned approximately on the top side of the cache data RAM and on the top-right side of the processor socket, the control chip comprising an address section having a plurality of address pins positioned at a bottom-middle portion of the control chip, a high-order-bit data section having a plurality of high order data pins positioned at a bottom-right corner of the control chip, and a low-order-bit data section having a plurality of low order data pins positioned at a bottom-left corner of the control chip;

a cache tag RAM installed on the top layer of the circuit board positioned roughly between the processor socket and the cache data RAM, the cache tag RAM comprising an address section having a plurality of address pins;

a high-order-bit data bus comprising a plurality of conductors for connecting the high-order-bit data section of the processor socket, the high-order-bit data section of the cache data RAM, and the high-order-bit data section of the control chip through the top and bottom layers of the circuit board for transmitting high-order-bit data;

a low-order-bit data bus comprising a plurality of conductors for connecting the low-order-bit data section of the processor socket, the low-order-bit data section of the cache data RAM, and the low-order-bit data section of the control chip through the top and bottom layers of the circuit board for transmitting low-order-bit data; and an address bus comprising a plurality of conductors for connecting the address section of the processor socket, the address section of the cache tag RAM, the address section of the control chip, and the address section of the cache data RAM through the top and bottom layers of the circuit board for transmitting data addresses. The address bus can be divided into a high-order-bit address bus and a low-order-bit address bus over which the high-order-bit address bus is connected between the high-order-bit address section of the processor socket and correspondent high-order-bit address pins of the address section of the control chip, and the low-order-bit address bus is connected among the low-order-bit address section of the processor socket, the address section of the cache tag RAM, the address section of the cache data RAM, and correspondent low-order-bit address pins of the address section of the control chip. The length of the low-order-bit address bus between the low-order-bit address section of the processor socket and the address section of the cache tag RAM is less than 3700 mil, between the address section of the cache tag RAM and the address section of the control chip is less than 3000 mil, and between the low-order-bit address section of the processor socket and the address section of the cache data RAM is less than 6700 mil.

It is an advantage of the present invention that the control chip provides a new data pin and address pin arrangement which allows much better arrangement of the address bus between the processor socket, control chip, cache tag RAM, and cache data RAM so that the length of the address bus is substantially shortened, and the cache tag RAM and cache data RAM can be quickly accessed from the processor socket.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 2:
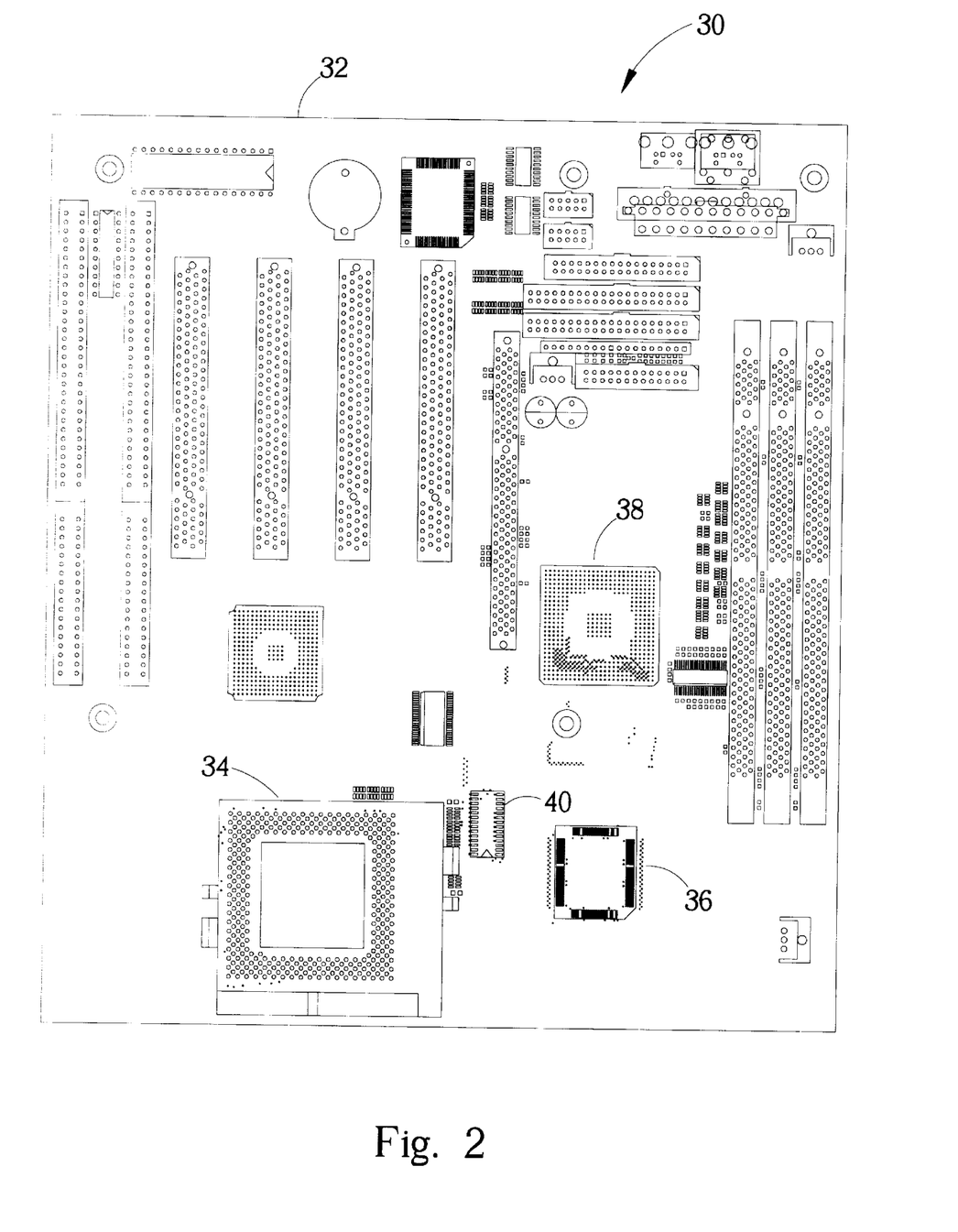
FIG. 2 is a component layout diagram of a computer motherboard according to the present invention.
Figure 3:
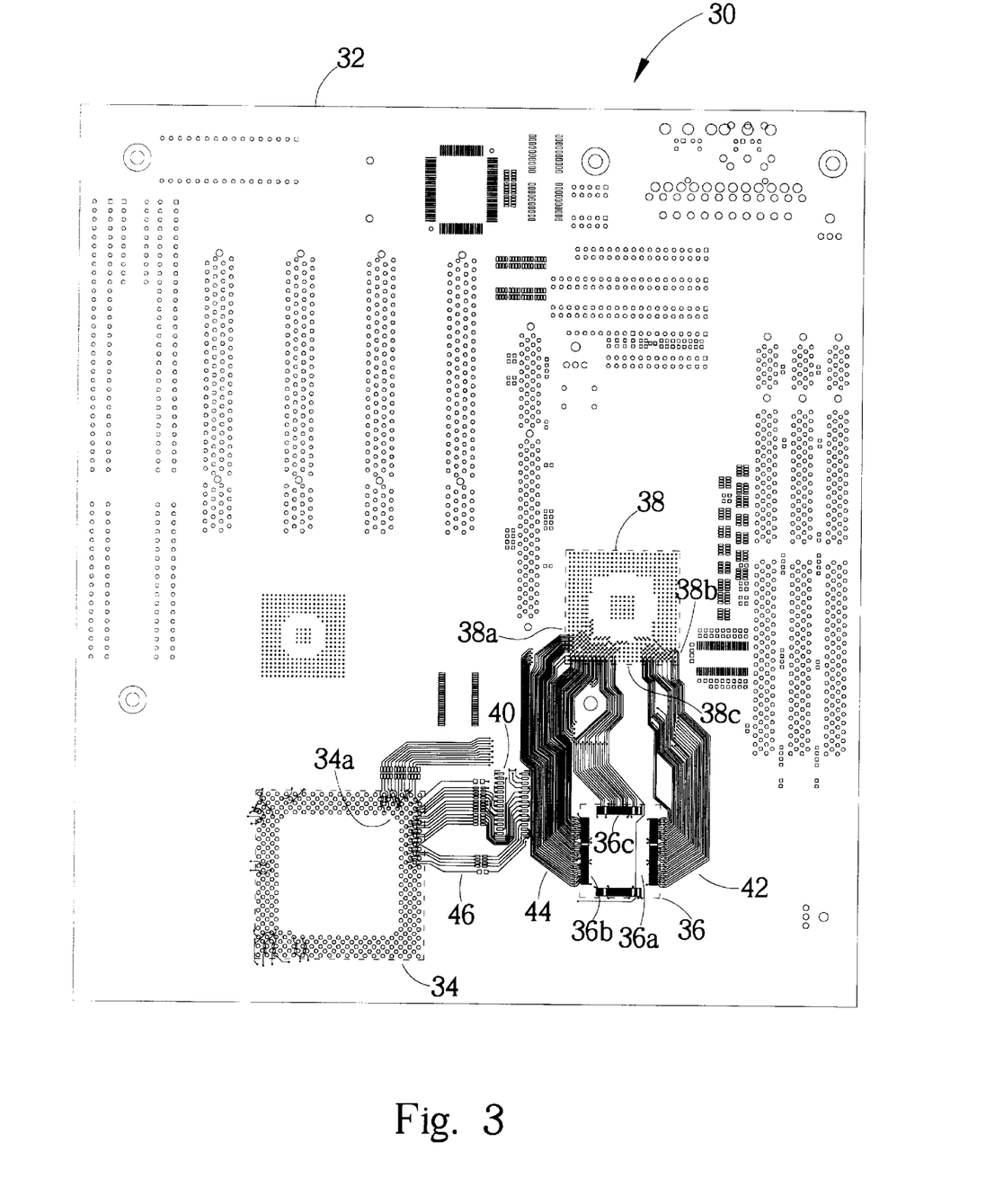
FIG. 3 is a layout diagram of a top layer of the computer motherboard shown in FIG. 2.
Figure 4:
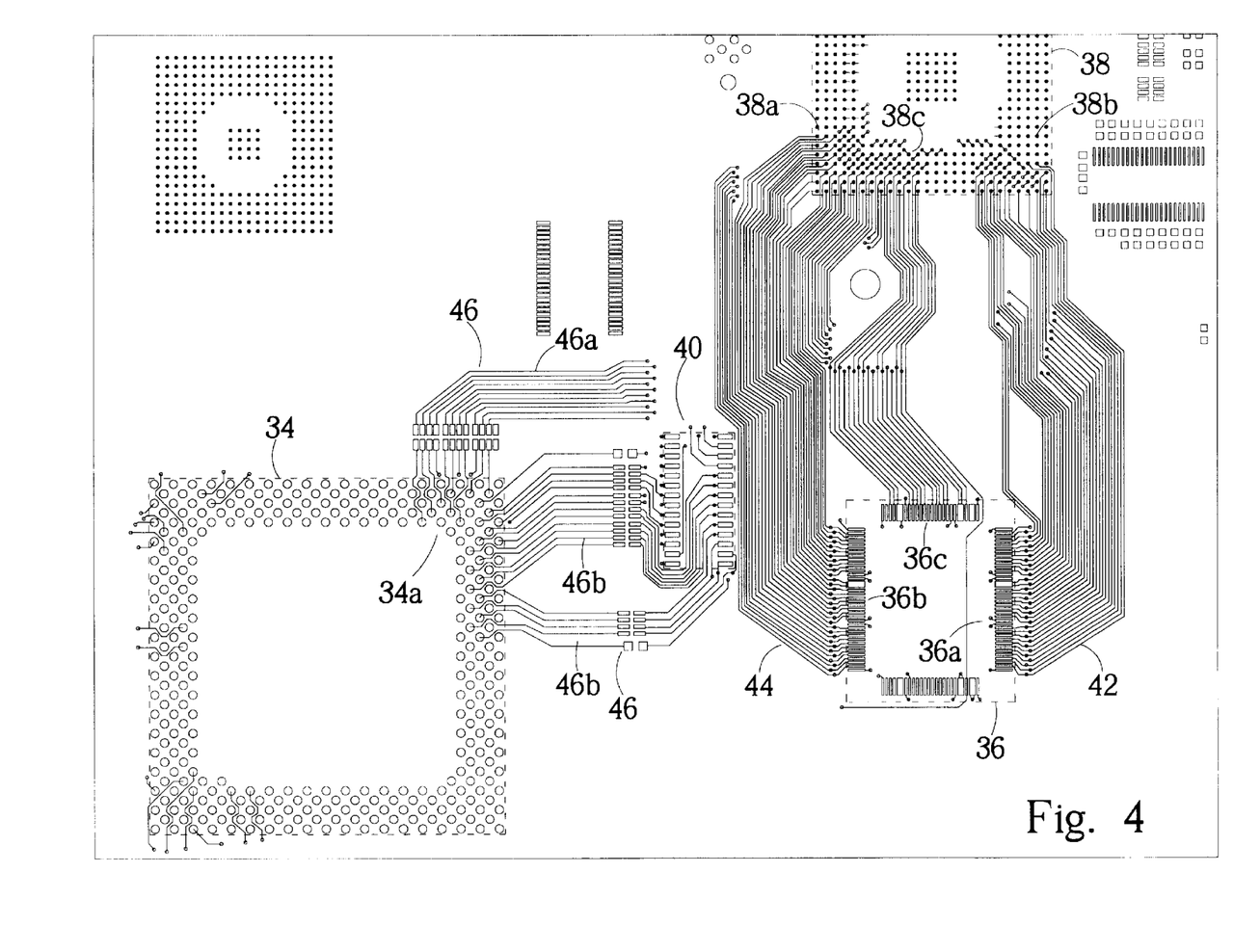
FIG. 4 is an enlarged layout diagram which shows portion of the top layer layout in FIG. 3.
Figure 5:
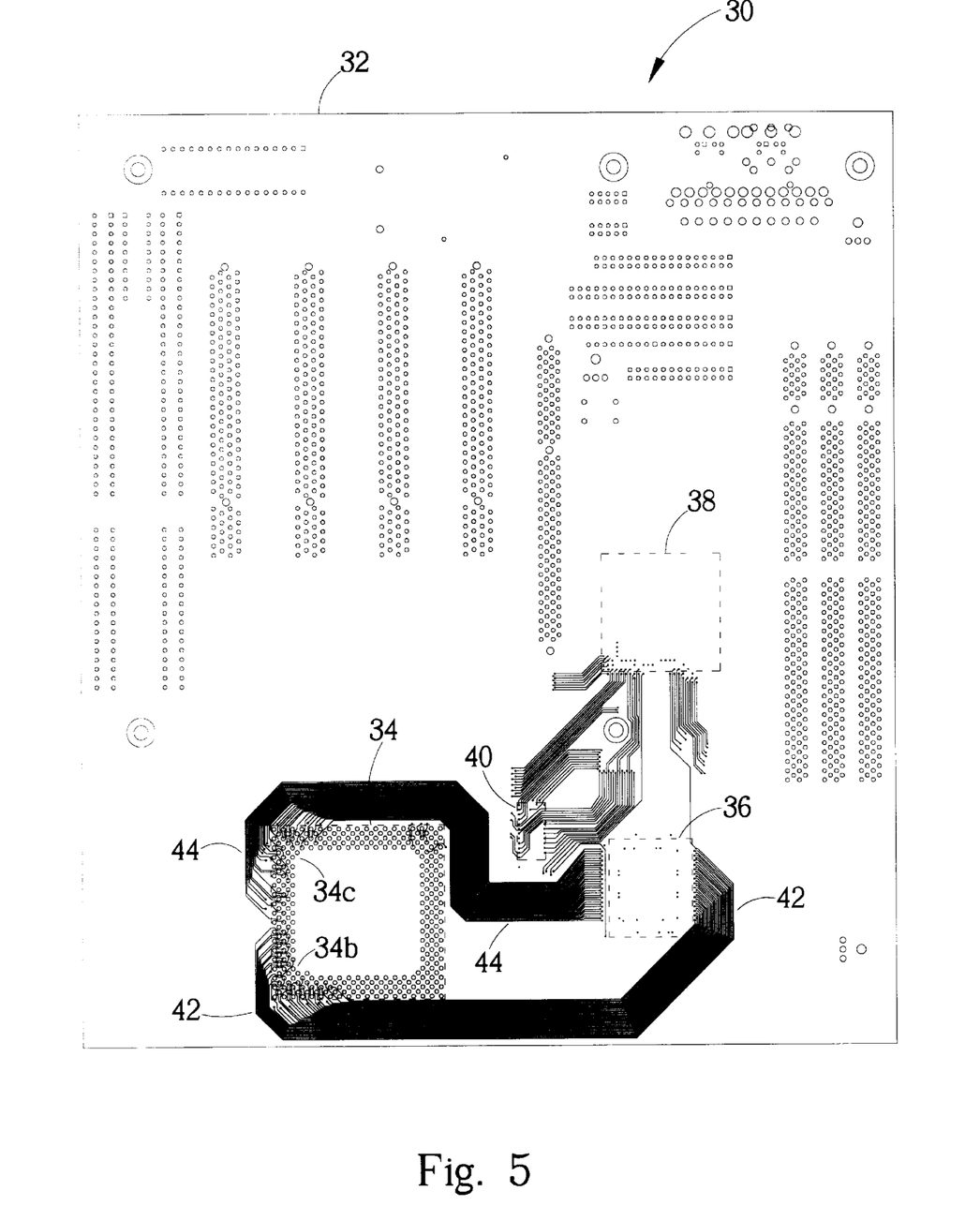
FIG. 5 is a layout diagram of a bottom layer of the computer motherboard shown in FIG. 2.
Figure 6:
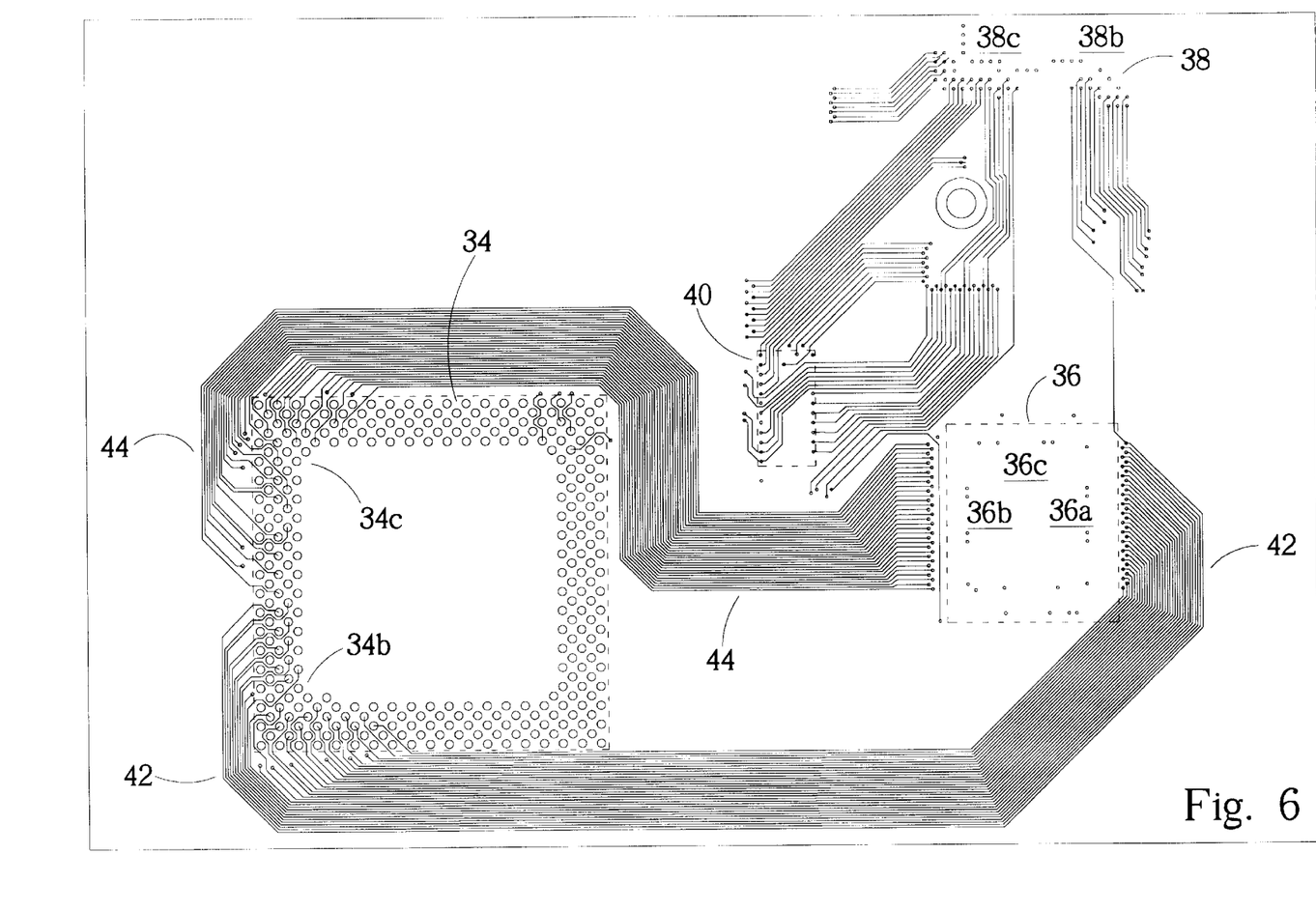
FIG. 6 is an enlarged layout diagram which shows portion of the bottom layer layout in FIG. 5.

Please refer to FIGS. 2 to 6. FIG. 2 is a component layout diagram of a computer motherboard 30 according to the present invention. FIG. 3 is a layout diagram of a top layer of the computer motherboard 30. FIG. 4 is an enlarged layout diagram which shows portion of the top layer layout shown in FIG. 3. FIG. 5 is a layout diagram of a bottom layer of the computer motherboard 30. FIG. 6 is an enlarged layout diagram which shows portion of the bottom layer layout shown in FIG. 5. The computer motherboard 30 comprises a four-layer printed circuit board 32, a processor socket 34, a cache data RAM 36, a control chip 38, a cache tag RAM 40, a high-order-bit data bus 42 having 32 conductors, a low-order-bit data bus 44 having 32 conductors, and an address bus 46 having 32 conductors.

The four-layer printed circuit board 32 comprises a top layer, a bottom layer, and two middle layers for connecting power supply and ground separately. The printed circuit board 32 has four sides: top, bottom, left and right sides. The processor socket 34 is installed at the bottom-left corner of the top layer of the circuit board 32. The cache data RAM 36 is installed roughly next to the right side of the processor socket 34. The control chip 38 is installed roughly next to the top side of the cache data RAM 36 and the top-right side of the processor socket 34. And the cache tag RAM 40 is installed roughly between the processor socket 34 and the cache data RAM 36.

The pin definition of the processor socket 34 is compatible with the Intel Processor P54C, and a Intel P54C compatible processor can be directly installed on the position of the processor socket 34 without using the processor socket 34. The processor socket 34 comprises an address section 34a having 32 address pins (A0–A31) positioned on the top-right corner of the processor socket 34, and a data section having 64 data pins (D0–D63) positioned on the left side of the processor socket 34. The data section can be divided into a high-order-bit data section 34b having 32 data pins at the bottom-left corner of the processor socket 34, and a low-order-bit data section 34c having 32 data pins positioned on the top-left corner of the processor socket 34. The cache data RAM 36 comprises a high-order-bit data section 36a having 32 data pins positioned on the right side of the cache data RAM 36, a low-order-bit data section 36b having 32 data pins positioned on the left side of the cache data RAM 36, and an address section 36c having 16 address pins positioned on the top side of the cache data RAM 36. The control chip 38 comprises an address section 38c having 32 address pins (A0–A31) positioned on the bottom-middle portion of the control chip 38, a high-order-bit data section 38b having 32 data pins (D32–D63) positioned on the bottom-right corner of the control chip 38, and a low-order-bit data section 38a having 32 data pins (D0–D31) positioned on the bottom-left corner of the control chip 38. The cache tag RAM 40 comprises an address section having 16 address pins.

The high-order-bit data bus 42 contains 32 conductors and is used for connecting the high-order-bit data section 34b of the processor socket 34, the high-order-bit data section 36a of the cache data RAM 36, and the high-order-bit data section 38b of the control chip 38 through the top and bottom layers of the circuit board 32 for transmitting high-order-bit data. The high-order-bit data bus 42 connected between the high-order-bit data section 34b of the processor socket 34 and the high-order-bit data section 36a of the cache data RAM 36 is passed around the bottom side of the processor socket 34 (see FIG. 5). The low-order-bit data bus 44 contains 32 conductors and is used for connecting the low-order-bit data section 34c of the processor socket 34, the low-order-bit data section 36b of the cache data RAM 36, and the low-order-bit data section 38a of the control chip 38 through the top and bottom layers of the circuit board 32 for transmitting low-order-bit data. The low-order-bit data bus 44 connected between the low-order-bit data section 34c of the processor socket 34 and the low-order-bit data section 36b of the cache data RAM 36 is passed around the top side of the processor socket 34 (see FIG. 5).

The address bus 46 contains 32 conductors and is used for connecting the address section 34a of the processor socket 34, the address section of the cache tag RAM 40, the address section 38c of the control chip 38 and the address section 36c of the cache data RAM 36 through the top and bottom layers of the circuit board 32 for transmitting data addresses.

The 32 conductors of the address bus 46 is divided into a high-order-bit address bus 46a and a low-order-bit address bus 46b (see FIG. 4). The high-order-bit address bus 46a is used for directly connecting the high-order-bit address pins of the address section 34a of the processor socket 34 and the correspondent address pins of the address section 38c of the control chip 38. The low-order-bit address bus 46b is used for connecting the low-order-bit address pins of the address section 34a of the processor socket 34, the address section of the cache tag RAM 40, the address section 36c of the cache data RAM 36, and the correspondent address pins of the address section 38c of the control chip 38.

Comparing with the prior art control chip 18 in FIG. 1, the pin arrangement of the control chip 38 according to the present invention allows the components and buses on the circuit board 32 to be arranged effectively so that a processor mounted on the processor socket 34 can access the cache tag RAM 40 and cache data RAM 36 quickly. The conductors of the low-order-bit address bus 46b connected between the address section 34a of the processor socket 34 and the address section of the cache tag RAM 40 is less than 3700 mil, the conductors of the low-order-bit address bus 46b connected between the address section of the cache tag RAM 40 and the address section 38c of the control chip 38 is less than 3000 mil, and the conductors of the low-order-bit address bus 46b connected between the address section 34a of the processor socket 34 and the address section 36c of the cache data RAM 36 is less than 6700 mil. This arrangement shortens the conductors of the low-order-bit address bus 46b connected between the processor socket 34, the cache tag RAM 40 and the cache data RAM 36 greatly, and thus can effectively minimize the signal delay problem of the prior art computer motherboard 10.

Those skilled in the art will readily observe that numerous modifications and alternations of the device may be made while retaining the teachings of the invention. Accordingly, the above disclosure should be construed as limited only by the metes and bounds of the appended claims.

What is claimed is:

1. A computer motherboard comprising:
    a rectangular four-layer printed circuit board comprising a top layer and a bottom layer, the top layer comprising top, bottom, left and right sides;
    a processor socket installed near the bottom-left corner of the top layer of the circuit board, the processor socket comprising an address section having a plurality of address pins positioned at a top-right corner of the processor socket, and a data section having a plurality of data pins positioned at a left side of the processor socket, the data section being divided into a high-order-bit data section having a plurality of high order data pins positioned at a bottom-left corner of the processor socket, and a low-order-bit data section having a plurality of low order data pins positioned at a top-left corner of the processor socket;
    a cache data RAM installed on the top layer of the circuit board positioned approximately on the right side of the processor socket, the cache data RAM comprising a high-order-bit data section having a plurality of high order data pins, a low-order-bit data section having a plurality of low order data pins, and an address section having a plurality of address pins;
    a control chip installed on the top layer of the circuit board positioned approximately on the top side of the cache data RAM and on the top-right side of the processor socket, the control chip comprising an address section having a plurality of address pins positioned at a bottom-middle portion of the control chip, a high-order-bit data section having a plurality of high order data pins positioned at a bottom-right corner of the control chip, and a low-order-bit data section having a plurality of low order data pins positioned at a bottom-left corner of the control chip;
    a cache tag RAM installed on the top layer of the circuit board positioned roughly between the processor socket and the cache data RAM, the cache tag RAM comprising an address section having a plurality of address pins;
    a high-order-bit data bus comprising a plurality of conductors for connecting the high-order-bit data section of the processor socket, the high-order-bit data section of the cache data RAM, and the high-order-bit data section of the control chip through the top and bottom layers of the circuit board for transmitting high-order-bit data;
    a low-order-bit data bus comprising a plurality of conductors for connecting the low-order-bit data section of the processor socket, the low-order-bit data section of the cache data RAM, and the low-order-bit data section of the control chip through the top and bottom layers of the circuit board for transmitting low-order-bit data; and
    an address bus comprising a plurality of conductors for connecting the address section of the processor socket, the address section of the cache tag RAM, the address section of the control chip, and the address section of the cache data RAM through the top and bottom layers of the circuit board for transmitting data addresses.

2. The computer motherboard of claim 1 wherein each of the high-order-bit data section of the processor socket, the high-order-bit data section of the control chip, and the high-order-bit data section of the cache data RAM comprises 32 data pins (D32–D63) and is electrically interconnected by the high-order-bit data bus, and each of the low-order-bit data section of the processor socket, the low-order-bit data section of the control chip, and the low-order-bit data section of the cache data RAM comprises 32 data pins (D0–D31) and is electrically interconnected by the low-order-bit data bus.

3. The computer motherboard of claim 1 wherein the address bus can be divided into a high-order-bit address bus and a low-order-bit address bus over which the high-order-bit address bus is connected between the high-order-bit address section of the processor socket and correspondent high-order-bit address pins of the address section of the control chip, and the low-order-bit address bus is connected among the low-order-bit address section of the processor socket, the address section of the cache tag RAM, the address section of the cache data RAM, and correspondent low-order-bit address pins of the address section of the control chip.

4. The computer motherboard of claim 1 wherein the high-order-bit data bus is sequentially connected to the high-order-bit data section of the processor socket, the high-order-bit data section of the cache data RAM, and the data section of the control chip.

5. The computer motherboard of claim 1 wherein the low-order-bit data bus is sequentially connected to the low-order-bit data section of the processor socket, the low-order-bit data section of the cache data RAM, and the low-order-bit data section of the control chip.

6. The computer motherboard of claim 1 wherein the pin definition of the processor socket is compatible with the Intel Processor P54C.

7. The computer motherboard of claim 3 wherein the length of the low-order-bit address bus between the low-order-bit address section of the processor socket and the address section of the cache tag RAM is less than 3700 mil.

8. The computer motherboard of claim 3 wherein the length of the low-order-bit address bus between the address section of the cache tag RAM and the address section of the control chip is less than 3000 mil.

9. The computer motherboard of claim 3 wherein the length of the low-order-bit address bus between the low-order-bit address section of the processor socket and the address section of the cache data RAM is less than 6700 mil.

10. The computer motherboard of claim 3 wherein the length of the low-order-bit address bus between the low-order-bit address section of the processor socket and the address section of the cache tag RAM is less than 3700 mil, between the address section of the cache tag RAM and the address section of the control chip is less than 3000 mil, and between the low-order-bit address section of the processor socket and the address section of the cache data RAM is less than 6700 mil.

11. The computer motherboard of claim 4 wherein the high-order-bit data section of the cache data RAM is positioned at its right side, and the high-order-bit data bus is connected to the high-order-bit data section of the cache data RAM around the bottom side of the processor socket.

12. The computer motherboard of claim 5 wherein the low-order-bit data section of the cache data RAM is positioned at its left side, and the low-order-bit data bus is connected to the low-order-bit data section of the cache data RAM around the top side of the processor socket.

13. A computer motherboard comprising:
a rectangular four-layer printed circuit board comprising a top layer and a bottom layer, the top layer comprising top, bottom, left and right sides;
a processor installed near the bottom-left corner of the top layer of the circuit board, the processor comprising an address section having a plurality of address pins positioned at a top-right corner of the processor, and a data section having a plurality of data pins positioned at a left side of the processor, the data section being divided into a high-order-bit data section having a plurality of high order data pins positioned at a bottom-left corner of the processor, and a low-order-bit data section having a plurality of low order data pins positioned at a top-left corner of the processor;
a cache data RAM installed on the top layer of the circuit board positioned approximately on the right side of the processor, the cache data RAM comprising a high-order-bit data section having a plurality of high order data pins, a low-order-bit data section having a plurality of low order data pins, and an address section having a plurality of address pins;
a control chip installed on the top layer of the circuit board positioned approximately on the top side of the cache data RAM and on the top-right side of the processor, the control chip comprising an address section having a plurality of address pins positioned at a bottom-middle portion of the control chip, a high-order-bit data section having a plurality of high order data pins positioned at a bottom-right corner of the control chip, and a low-order-bit data section having a plurality of low order data pins positioned at a bottom-left corner of the control chip;
a cache tag RAM installed on the top layer of the circuit board positioned roughly between the processor and the cache data RAM, the cache tag RAM comprising an address section having a plurality of address pins;
a high-order-bit data bus comprising a plurality of conductors for connecting the high-order-bit data section of the processor, the high-order-bit data section of the cache data RAM, and the high-order-bit data section of the control chip through the top and bottom layers of the circuit board for transmitting high-order-bit data;
a low-order-bit data bus comprising a plurality of conductors for connecting the low-order-bit data section of the processor, the low-order-bit data section of the cache data RAM, and the low-order-bit data section of the control chip through the top and bottom layers of the circuit board for transmitting low-order-bit data; and
an address bus comprising a plurality of conductors for connecting the address section of the processor, the address section of the cache tag RAM, the address section of the control chip, and the address section of the cache data RAM through the top and bottom layers of the circuit board for transmitting data addresses.

14. The computer motherboard of claim 13 wherein each of the high-order-bit data section of the processor, the high-order-bit data section of the control chip, and the high-order-bit data section of the cache data RAM comprises 32 data pins (D32–D63) and is electrically interconnected by the high-order-bit data bus, and each of the low-order-bit data section of the processor, the low-order-bit data section of the control chip, and the low-order-bit data section of the cache data RAM comprises 32 data pins (D0–D31) and is electrically interconnected by the low-order-bit data bus.

15. The computer motherboard of claim 13 wherein the address bus can be divided into a high-order-bit address bus and a low-order-bit address bus over which the high-order-bit address bus is connected between the high-order-bit address section of the processor and correspondent high-order-bit address pins of the address section of the control chip, and the low-order-bit address bus is connected among the low-order-bit address section of the processor, the address section of the cache tag RAM, the address section of the cache data RAM, and correspondent low-order-bit address pins of the address section of the control chip.

16. The computer motherboard of claim 13 wherein the pin definition of the processor is compatible with the Intel Processor P54C.

17. The computer motherboard of claim 15 wherein the length of the low-order-bit address bus between the low-order-bit address section of the processor and the address section of the cache tag RAM is less than 3700 mil.

18. The computer motherboard of claim 15 wherein the length of the low-order-bit address bus between the address section of the cache tag RAM and the address section of the control chip is less than 3000 mil.

19. The computer motherboard of claim 15 wherein the length of the low-order-bit address bus between the low-order-bit address section of the processor and the address section of the cache data RAM is less than 6700 mil.

* * * * *